United States Patent
Freytag et al.

(10) Patent No.: US 12,111,579 B2
(45) Date of Patent: *Oct. 8, 2024

(54) METHOD AND APPARATUS FOR EVALUATING AN UNKNOWN EFFECT OF DEFECTS OF AN ELEMENT OF A PHOTOLITHOGRAPHY PROCESS

(71) Applicant: Carl Zeiss SMT GmbH, Oberkochen (DE)

(72) Inventors: Alexander Freytag, Erfurt (DE); Christoph Husemann, Jena (DE); Dirk Seidel, Jena-Leutra (DE); Carsten Schmidt, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/241,578

(22) Filed: Sep. 1, 2023

(65) Prior Publication Data
US 2023/0408929 A1    Dec. 21, 2023

Related U.S. Application Data

(63) Continuation of application No. 17/087,970, filed on Nov. 3, 2020, now Pat. No. 11,774,859, which is a (Continued)

(30) Foreign Application Priority Data

May 18, 2018   (DE) .......................... 102018207880.7

(51) Int. Cl.
*G01J 3/00*    (2006.01)
*G03F 7/00*    (2006.01)
(Continued)

(52) U.S. Cl.
CPC .............. *G03F 7/705* (2013.01); *G06F 30/20* (2020.01); *G06N 3/08* (2013.01); *G06N 20/00* (2019.01);
(Continued)

(58) Field of Classification Search
CPC .......... G06F 30/20; G06N 3/08; G06N 20/00; G06T 7/0006; G06T 7/001;
(Continued)

(56) References Cited

U.S. PATENT DOCUMENTS 7,379,924 B1    5/2008    Marathe et al.
9,087,176 B1    7/2015    Chang et al.
(Continued)

FOREIGN PATENT DOCUMENTS

JP    H 03-68845    3/1991
JP    2004-354251    12/2004
(Continued)

OTHER PUBLICATIONS

The International Search Report and Written Opinion for International Application No. PCT/EP2019/062646 dated Sep. 26, 2019.
(Continued)

*Primary Examiner* — Abdullahi Nur
(74) *Attorney, Agent, or Firm* — Fish & Richardson P.C.

(57) ABSTRACT

The present invention relates to a method and an apparatus for determining at least one unknown effect of defects of an element of a photolithography process. The method comprises the steps of: (a) providing a model of machine learning for a relationship between an image, design data associated with the image and at least one effect of the defects of the element of the photolithography process arising from the image; (b) training the model of machine learning using a multiplicity of images used for training purposes, design data associated with the images used for
(Continued)

training purposes and corresponding effects of the defects; and (c) determining the at least one unknown effect of the defects by applying the trained model to a measured image and the design data associated with the measured image.

26 Claims, 10 Drawing Sheets

Related U.S. Application Data continuation of application No. PCT/EP2019/062646, filed on May 16, 2019.

(51) Int. Cl.
  *G06F 30/20* (2020.01)
  *G06N 3/08* (2023.01)
  *G06N 20/00* (2019.01)
  *G06T 7/00* (2017.01)
  *G06V 10/75* (2022.01)
  *G06V 10/774* (2022.01)
  *G06V 20/13* (2022.01)

(52) U.S. Cl.
  CPC ............ *G06T 7/0006* (2013.01); *G06T 7/001* (2013.01); *G06V 10/751* (2022.01); *G06V 10/774* (2022.01); *G06V 20/13* (2022.01); *G06T 2207/10032* (2013.01); *G06T 2207/20081* (2013.01); *G06T 2207/20084* (2013.01); *G06T 2207/30148* (2013.01)

(58) Field of Classification Search
  CPC . G06T 2207/10032; G06T 2207/20081; G06T 2207/20084; G06V 10/774; G06V 20/13; G01J 3/00
  See application file for complete search history.

(56) References Cited

U.S. PATENT DOCUMENTS

| 2003/0086081 | A1  | 5/2003 | Lehman |
| 2014/0241610 | A1* | 8/2014 | Duffy ........................ G06T 7/50 |
| | | | 382/145 |
| 2016/0313651 | A1  | 10/2016 | Middlebrooks et al. |
| 2017/0140524 | A1  | 5/2017 | Karsenti et al. |
| 2017/0255112 | A1  | 9/2017 | Van Leest et al. |
| 2017/0345140 | A1  | 11/2017 | Zhang et al. |
| 2018/0121592 | A1  | 5/2018 | Watanabe et al. |
| 2018/0232873 | A1  | 8/2018 | Inoue et al. |
| 2018/0314163 | A1  | 11/2018 | Liu |
| 2019/0147127 | A1  | 5/2019 | Su et al. |
| 2021/0073969 | A1  | 3/2021 | Freytag et al. |

FOREIGN PATENT DOCUMENTS

| JP | 2016-145887 | 8/2016 |
| JP | 2017-514294 | 6/2017 |
| TW | 201743141 | 12/2017 |
| WO | WO 2014/186407 | 11/2014 |
| WO | WO 2017/073604 | 5/2017 |
| WO | WO 2017/087653 | 5/2017 |
| WO | WO 2017/117568 | 7/2017 |
| WO | WO 2017/117573 | 7/2017 |
| WO | WO 2017/120253 | 7/2017 |
| WO | WO 2017/123553 | 7/2017 |
| WO | WO 2017/123555 | 7/2017 |
| WO | WO 2017/123561 | 7/2017 |
| WO | WO 2017/194281 | 11/2017 |
| WO | WO 2017/205537 | 11/2017 |
| WO | WO 2018/089459 | 5/2018 |

OTHER PUBLICATIONS

The Notice of Allowance issued by the Korean Patent Office for Application No. KR 10-2020-7036616, dated Apr. 3, 2023 (English Translation).
The Notice of Reasons for Rejection issued by the Japanese Patent Office for Application No. JP 2021-514481, dated Oct. 6, 2021 (with English Translation).

* cited by examiner

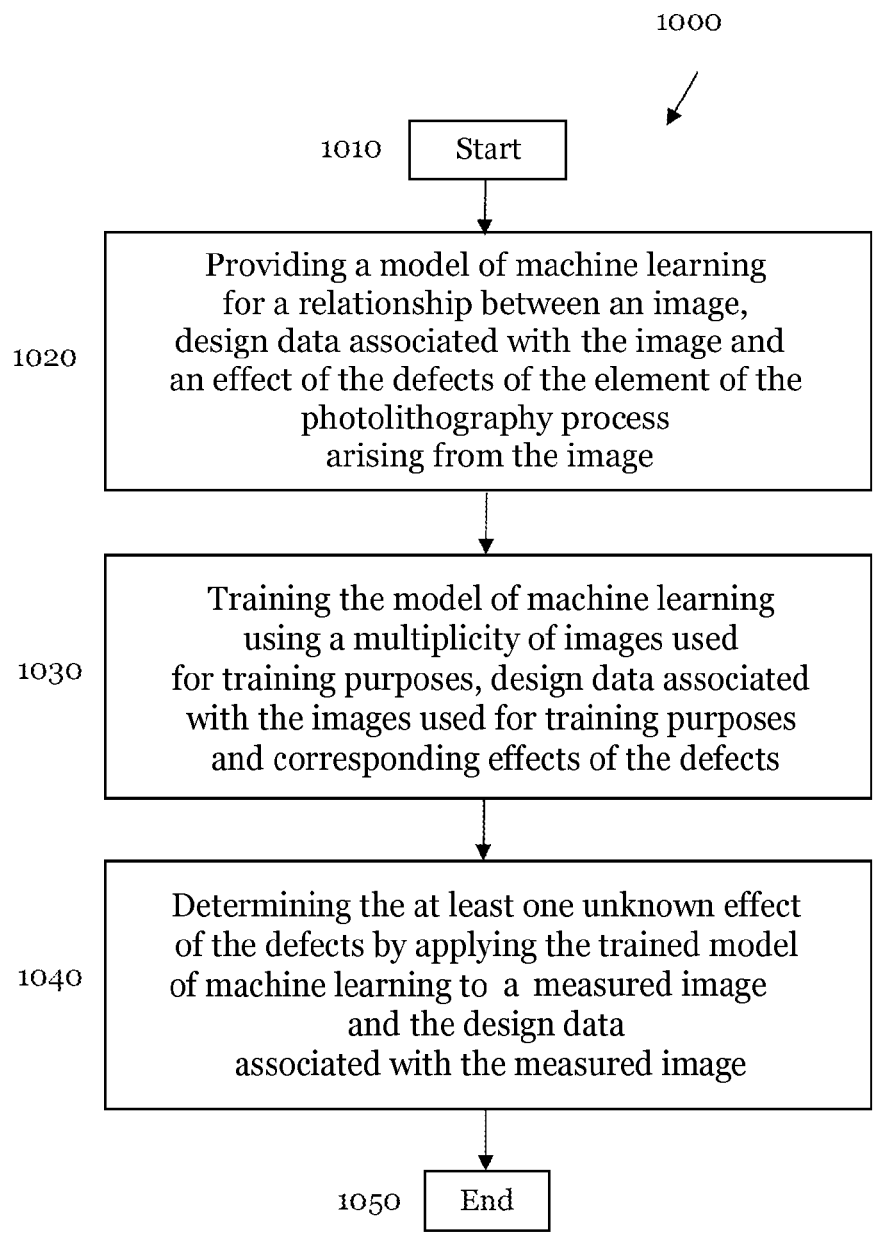

METHOD AND APPARATUS FOR EVALUATING AN UNKNOWN EFFECT OF DEFECTS OF AN ELEMENT OF A PHOTOLITHOGRAPHY PROCESS

CROSS-REFERENCE TO RELATED APPLICATIONS

This application is a continuation of and claims priority under 35 U.S.C. § 120 to U.S. application Ser. No. 17/087,970, filed on Nov. 3, 2020, which is a continuation of PCT Application No. PCT/EP2019/062646, filed on May 16, 2019, which claims priority from German Application No. DE 10 2018 207 880.7, filed on May 18, 2018. The entire contents of each of these priority applications are incorporated herein by reference.

TECHNICAL FIELD

The present invention relates to a method and an apparatus for evaluating an unknown effect of defects of an element of a photolithography process. In particular, the present invention relates to a method and an apparatus for evaluating an unknown effect of defects for one or more elements of a photolithography process by applying a model of machine learning, which establishes a relationship between an image, design data associated with the image and an effect of the defects arising from the image.

BACKGROUND

As a consequence of the growing integration density in the semiconductor industry, photolithography masks or templates for nanoimprint lithography have to image increasingly smaller structures on wafers. The advances in miniaturization of structures on semiconductor wafers and hence also on the photolithographic masks, photomasks or simply masks used to expose the wafers have far-reaching effects on the inspection of photolithographic masks, the metrology of photomasks and the analysis of mask defects. Typically, a photomask is analyzed by virtue of measuring an aerial image of a mask portion and comparing the latter to a reference aerial image of the mask portion. In the specialist field, this procedure is referred to as a die-to-die method. It is possible to ascertain a defect probability map, a defect map, or a defect effect map of defects of the mask portion on the basis of this comparison.

The increasing complexity of the structures on photomasks, for example amplified by the more frequent application of optical proximity corrections (OPCs), may lead to certain structures on a photomask no longer being repeated or only still being repeated infrequently (so-called single die masks). Hence, a quality assessment of such masks (e.g., a defect inspection or defect review) is no longer possible or only possible with greater outlay, i.e., after a longer search for a suitable reference position, by use of the above-described die-to-die method.

A method that can be used in such cases (but also independently thereof) is the so-called die-to-database method, in which a reference aerial image is obtained by use of an optical imaging simulation (rendering) from design data, for example from layout data. The method in which a reference image is generated from design data of a mask can be used independently of the aforementioned problem.

A reference aerial image of a mask with the aid of the simulation could previously be generated in two ways. Firstly, a reference aerial image can be calculated with the aid of an ab-initio or rigorous simulation. However, producing reference aerial images for analyzing defects and/or for correcting defects on the basis of ab-initio simulations, which numerically solve Maxwell's equations, is very time-consuming and therefore currently, and in the near future, hardly practical in a manufacturing environment.

Secondly, use can be made of a simplified model, which assumes the mask structures to be two-dimensional and the diffracted waves to be freely propagating, which is known as "Kirchhoff model" or as "scalar imaging model," for the purposes of generating a reference aerial image from design data by use of a simulation. A simulation of a reference aerial image on the basis of the Kirchhoff model is orders of magnitude faster than a rigorous simulation; however, it is not able to image all mask effects sufficiently accurately. Hence, the quality of a reference aerial image produced by use of a Kirchhoff model is insufficient in many cases.

In a new, further approach, attempts are currently being made to approach numerous challenges in the quality assessment of photomasks with the aid of a machine learning (ML) model. The following documents are specified in an exemplary manner for this procedure: WO 2017/087653 A 1, WO 2017/117568 A1, WO 2017/120253 A1, WO 2017/123555 A1, WO 2017/123561 A1, WO 2017/117573 A1, WO 2017/123555 A1 and WO 2017/205537 A1.

As explained above, the production of a reference aerial image for a photolithographic mask can be a complicated process, both by measurement and with the aid of simulation.

An aspect of the present invention is to specify a method and an apparatus that at least partly avoid the above-described disadvantages when evaluating the quality of a photolithographic mask.

SUMMARY

According to one aspect of the present invention, this problem is solved by a method for determining at least one unknown effect of defects of an element of a photolithography process. The method can comprise the steps of: (a) providing a model of machine learning for a relationship between an image, design data associated with the image and at least one effect of the defects of the element of the photolithography process arising from the image; (b) training the model of machine learning using a multiplicity of images used for training purposes, design data associated with the images used for training purposes and corresponding effects of the defects; and (c) determining the at least one unknown effect of the defects by applying the trained model of machine learning to a measured image and the design data associated with the measured image. A method according to the invention avoids the complicated production of a reference image for being able to assess the quality of a photolithographic mask and/or a wafer. Further, a method according to the invention makes the comparison of a measured image with a reference image superfluous.

By way of example, the complicated training process of the model of machine learning or of the ML model can be carried out once for a specific mask type and a certain optical measuring system, which produces the aerial images. By way of example, the training process can be carried out at a central location, which is optimally equipped for this object. The trained ML models for different mask types can then be provided together with the optical measuring or imaging system and the design data in a manufacturing environment. By applying the trained ML model to a measured aerial image and by providing the associated design data, it is then possible to determine a previously unknown effect of the defects in a portion of the mask represented by the measured aerial image, either directly or after minimal fitting.

A model of machine learning produces knowledge from experience. A model of machine learning learns from examples that are provided to the model in the form of training or learning data in a learning or training phase. Using this, internal variables of the model, for example parameters of parametric mapping, can be occupied by suitable values in order to be able to describe relationships in the training data. As a consequence, the ML model in the training phase as a rule does not simply learn the training data off by memorizing but identifies patterns and/or rules in the training data. The quality of the learned relationships is typically assessed on the basis of validation data in order to assess the generalizability of the trained model to new data, i.e., data that is unknown during the training. A trained ML model can be applied to an element of a photolithography process in order to predict the potential effects of defects in an image unknown to the ML model should the associated design data be provided. After the completion of the training phase, a successfully trained ML model, i.e., a trained ML model with good generalizability is therefore able to assess data unknown to it, i.e., unknown images, if the associated design data are provided.

The image can comprise at least one element from the group: an image recorded by an optical measuring system, an image recorded by a scanning particle microscope, and an image recorded by a scanning probe microscope.

An optical measuring system can comprise an AIMS™, PROVE®, and/or WLCD tool. A scanning particle microscope can comprise a scanning electron microscope (SEM) and/or a scanning ion microscope. A scanning probe microscope can comprise an element from the group: a scanning tunneling microscope, a scanning force microscope, a magnetic force microscope, a near-field scanning optical microscope and a scanning near-field acoustic microscope.

The application of a method according to the invention is not restricted to images recorded by an optical measurement system. Rather, a method according to the invention can be used for images that were produced by different imaging modalities.

The design data can comprise at least one element from the group: layout data and computer-aided design (CAD) data. The design data can be available in the form of pixel data and/or polygons or polygonal chains.

The model of machine learning can comprise a sub-symbolic system.

The knowledge, i.e., the training data and the induced rules, is explicitly represented in the case of a symbolic system. In the case of a sub-symbolic system, a calculable behavior is taught to the model without, however, having a detailed view into the learnt solution paths.

The model of machine learning can comprise at least one element from the group: a parametric mapping, an artificial neural network (ANN), a deep neural network (DNN), a time delay neural network, a convolutional neural network (CNN), a recurrent neural network (RNN), a long short-term memory (LSTM) network, and a generative model.

Discriminative models can produce output data from input data; generative models can produce output data from input data and can additionally reproduce the input data.

The model of machine learning can comprise: (a) at least one encoder block for determining information-carrying features of an image and the design data associated with the image; and (b) at least one decoder block for producing at least one effect of the defects from the determined information-carrying features.

Further, the model of machine learning can comprise: (a) at least one encoder layer for determining information-carrying features of an image and the design data associated with the image; and (b) at least one decoder layer for producing at least one effect of the defects from the determined information-carrying features, wherein the effect of the defects shows what an overlay of the image with a reference image looks like.

The model of machine learning can comprise at least 2, preferably 10 to 1500, more preferably 15 to 1000 and most preferably 30 to 100 layers.

The layers of the model of machine learning can realize various parameterized and non-parameterized functions. Thus, an artificial neural network can comprise two or more convolutional layers and two or more deconvolutional layers. Here, the size of the convolutional filters can be selected to be larger, especially for a small number of convolutional layers, in order to be able to resort to sufficiently many data during the processing. Further, the artificial neural network can comprise two or more pooling layers and two or more de-pooling layers. Moreover, a model of machine learning can contain two or more nonlinear activation functions for realizing complex relationships, for instance a hyperbolic tangent, a sigmoid and/or a piecewise linear function. Independently thereof, a model of machine learning can contain two or more adaptive normalization layers, for instance a batch normalization.

The method according to the invention can further include the step of: fitting a number of layers of the model of machine learning to a predetermined or demanded accuracy of an aerial image. In particular, the method according to the invention can include the step of: fitting a number of encoder layers and/or decoder layers to a predetermined accuracy of an image.

Artificial neural networks (ANN) typically consist of the linking of a plurality of layers, which consequently realize a sequential transformation of the inputs into outputs, for example. The topology of the network, i.e., the number of layers, the choice of the function of each layer, the parameters or model parameters of each of the layers (such as the number and the size of filter kernels), and the connections between the individual layers are selected depending on the object to be achieved. Here, it is possible for the outputs of one layer of the ANN to be provided as inputs not only to a subsequent layer.

The element of the photolithography process can comprise at least one element from the group: a photolithographic mask, a template for nanoimprint technology and a wafer. The photolithographic mask can comprise a transmitting or reflecting mask.

A method according to the invention is not restricted to determining an arrangement of defects of a photolithographic mask. Rather, it can also be used for analyzing templates from the field of nanoimprint technology and wafers.

The defects can comprise at least one element from the group: placement errors of one or more pattern elements of one or more elements of the photolithography process; critical dimension errors of one or more pattern elements of the element of the photolithography process; and material defects of the element of the photolithography process.

Determining the at least one unknown effect of a defect can comprise at least one answer to one of the following questions: Is the effect of the defect below a predetermined threshold? Is the defect visible on a wafer? Is the defect that is visible on a wafer correctable? The image recorded by the optical imaging system can comprise an aerial image and/or the aerial image can comprise an aerial image focus stack.

The same design data underlie the various aerial images of a focus stack. The precision of the prediction of the effect of defects of an element of a photolithography process can be increased by at least partial training of the ML model using an aerial image focus stack instead of an individual aerial image. The ML model required to this end is realizable, for example, as a common model which receives either data from aerial image focus stacks or individual aerial images as inputs. However, it is also possible to use two separate ML models, which are coupled via common parameter values, for example.

The training of the model of machine learning can comprise: providing the multiplicity of aerial images used for training purposes and the multiplicity of design data associated with the aerial images used for training purposes as input data and providing the multiplicity of effects of the defects corresponding to the aerial images used for training purposes as comparison data for the output data of the model of machine learning.

It is a feature of the present application that data from two data sources are presented to the ML model in each case, both during the training phase and during the use phase, said data sources having a connection to one another.

The aerial images used for training purposes can comprise measured aerial images and/or simulated aerial images.

It is an advantage of the method according to the invention that the aerial images required for training purposes need not all be measured.

The method according to the invention can further include the step of: simulating design data and/or modified design data of the element of the photolithography process for the purposes of producing simulated images. Further, the method according to the invention can include the step of: simulating design data and/or modified design data of a photolithographic mask for the purposes of producing simulated aerial images.

A training data record should comprise images or aerial images without defects, i.e., images or aerial images that can be used as reference images and reference aerial images, respectively. However, additionally, a training data record should also comprise images/aerial images that have a multiplicity of the known relevant defects of an element of a photolithography process or of the known relevant mask defects in the case of photomasks. Should the images/aerial images used for training purposes have been generated in part or as a whole with the aid of a simulation tool, the design data underlying the simulated images/aerial images can be changed or modified in such a way that the simulated images/aerial images exhibit the known relevant defects of the element of the photolithography process, for example the known relevant mask defects.

Producing simulated images/aerial images can comprise at least one element from the group: carrying out a rigorous simulation by numerically solving Maxwell's equations, wherein design data and/or modified design data of the element of the photolithography process are used as input data, carrying out a simulation with the aid of a Kirchhoff model, wherein the design data and/or the modified design data of the element of the photolithography process are used as input data, carrying out a particle-beam-based imaging simulation, wherein design data and/or modified design data of the element of the photolithography process are used as input data and carrying out a scanning-probe-based imaging simulation, wherein design data and/or modified design data of the element of the photolithography process are used as input data.

Training the model of machine learning can comprise determining learnable parameters of the model of machine learning. In the case of convolutional layers, the training of the model of machine learning can comprise determining weights of the filter masks.

In the case of convolutional and deconvolutional layers, the learnable parameters are typically the weights of the filter masks of the individual convolutional layers. In order to increase the model complexity, the convolutional results of a layer are usually additionally transformed in nonlinear fashion. To this end, as already referred to above, the input of each neuron, ascertained by use of a discrete convolution, is converted into an output in a convolutional layer with the aid of an activation function, i.e., for example, by the application of a sigmoid function $(sig(t)=0.5 \cdot (1+tanh(t/2))$ or a rectified linear unit (ReLU, $f(x)=max(o, x)$). The concatenation of a plurality of convolutional layers, which each comprise an activation function, allows complex patterns to be learned from the provided data—both for perception objectives and for transforming between various data modalities (for example, between design data and image data).

An ML model employed in this application has the feature that the latter predicts an output, specifically at least one effect of at least one defect of an element of a photolithography process, on the basis of two input data records, specifically an image and design data. In a first embodiment, the two input data records can be concatenated to form a single input. In this embodiment, the architecture of the ML model does not differ from conventional exemplary embodiments.

However, in a second embodiment, it is also possible for the ML model to have two separate branches or input branches on the input side for the two image and design data inputs, which are combined within the ML model. This second embodiment facilitates separate processing of the two inputs in order to prepare these in targeted fashion for common processing in one or more common layers of the ML model. The two separate input branches of the ML model can have the same number of layers. However, it is currently preferred to fit the number of layers of the two input branches of the ML model to the specifics of the respective input data. Individual layers of the two separate input branches can be connected to one another.

The second embodiment of an ML model, as explained above, can be trained in various ways: The initial model parameters (I) can be chosen randomly, (II) can be adopted from an ML model that has already carried out a similar objective and/or (III) can be pre-learnt in unsupervised fashion.

Regarding (I): Should the initial numerical values of the model parameters be chosen randomly, the same random distribution or different random distributions can be chosen for the two input branches of the ML model.

Regarding (II): Should other ML models, which have the same or a similar architecture as/to the two input branches of the ML model in training, already be used, the model parameters thereof can be used as initial model parameters for the training phase. As a result, the initial numerical values of the model parameters for the training process can be set separately for the two separate input branches of the ML model. The training process of the ML model can be simplified by the modular determination of the initial model parameters.

Regarding (III): Should the two input branches of the ML model be embodied as auto encoders, i.e., the input data of the input branches can be reproduced at the output thereof, as is the case, for example, if the input branches are realized in the form of encoder-decoder architectures, the model parameters determined from the reproduction of the input data can be used as start parameters of the ML model. The model parameters of the two input branches trained thus are often helpful for the initialization of the entire ML model in the training phase.

The provision of corresponding effects of defects for training the model of machine learning can further comprise the step of: overlaying an image used for training purposes with a reference image for producing the at least one effect of the defects corresponding to the image.

The provision of corresponding effects of defects for training the model of machine learning can further comprise the step of: determining a reference image by: imaging a substantially defect-free region of the element of the photolithography process, which has the same pattern elements as the region of the measured image, and/or simulating the design data for the region of the measured image of the element of the photolithography process. The provision of corresponding effects of defects for training the model of machine learning can further comprise the step of: determining a reference aerial image by: imaging a substantially defect-free region of the photolithographic mask, which has the same pattern elements as the region of the measured aerial image, and/or simulating the design data for the region of the measured aerial image of the photolithographic mask.

Overlaying the image with the reference image can comprise: forming a difference between the image and the reference image. Further, overlaying the aerial image with the reference aerial image can comprise: forming a difference between the aerial image and the reference aerial image.

Forming the difference can comprise at least one element from the group: determining a deviation of a critical dimension (CD), determining a contrast deviation, and determining a placement deviation of one or more pattern elements.

Typically, a measured image, just like a reference image, is present in the form of a two-dimensional pixel arrangement. Each pixel is normally associated with a certain bit depth such that the latter can be represented as greyscale value steps. A difference image, which illustrates the effect of defects, arises by an overlay of reference aerial image and aerial image.

An effect of defects of an element of a photolithography process, for example a photomask, can be captured in a defect effect map. A defect effect map describes effects of deviations of a measured image in relation to a reference image, as explained above. By way of example, the arrangement of the printable defects, i.e., the defects visible on a wafer on the mask or the mask portion, can then be ascertained directly from the defect effect map by predetermining one or more threshold conditions. Moreover, in addition to the predicted effects of the defect, the ML model can be trained to additionally predict whether a printable defect can be corrected.

The training further can include the step of: comparing the at least one effect of the defects determined by a model of machine learning in training from the image used for training purposes with the at least one effect of the defects corresponding to the image used for training purposes.

The training of the model of machine learning can comprise supervised learning. Supervised learning is described in the book "Pattern Recognition and Machine Learning" by C. M, Bishop, Springer 2006, ISBN-10: 0-387-31073-8.

The training of the model of machine learning can comprise: (a) training the model of machine learning using a first number of simulated images, design data associated with the simulated images with corresponding effects of the defects in a first phase; and (b) training the model of machine learning using a second number of measured images, design data associated with the measured images with corresponding effects of the defects in a second phase, with the first phase being carried out before the second phase. The first number of simulated images can be greater than the second number of measured images. The first number of simulated images can be greater than the second number of measured images by a factor of 10.

The training of the model of machine learning can further comprise the step of: running through the aforementioned steps (a) and (b) at least twice.

It can be complicated to measure the large number of images, for example thousands of images, for instance aerial images, which are required for training the ML model. The method according to the invention renders it possible to train the ML model on the basis of simulated images and associated design data in a first step. Simulated images can be produced in a large number with the aid of a simulation tool. In a second step, the ML model that was pre-trained by use of the simulated images is finally prepared for its use with the aid of a restricted number of measured images.

A computer program can comprise instructions which, when executed by a computer system, prompt the computer system to carry out the method steps of the aspects specified above.

According to a further aspect of the present invention, the problem specified above is solved by an apparatus for determining at least one unknown effect of defects of an element of a photolithography process. The apparatus can comprise: (a) means for providing a model of machine learning for a relationship between an image, design data associated with the image and at least one effect of the defects arising from the image; (b) means for training the model of machine learning using a multiplicity of images used for training purposes, design data associated with the images used for training purposes and corresponding effects of the defects; and (c) means for determining the at least one unknown effect of the defects by applying the trained model of machine learning to a measured image and the design data associated with the measured image.

The apparatus can comprise an exposure system for the element of the photolithography process and a magnifying lens that is embodied to image a portion of the element of the photolithography process on a photodetector. The apparatus can comprise an AIMS™ tool.

DESCRIPTION OF DRAWINGS

The following detailed description describes currently preferred exemplary embodiments of the invention, with reference being made to the drawings, in which:

FIG. 10 finally illustrates a flowchart of a method for determining an unknown arrangement of defects of an element of a photolithography process.

DETAILED DESCRIPTION

Currently preferred embodiments of the method according to the invention and the apparatus according to the invention are explained in more detail below on the basis of determining an unknown effect of defects of a photolithographic mask. However, the application of the method according to the invention and of the apparatus according to the invention is not restricted to photomasks. Rather, said apparatus and method can be applied to further elements of a photolithography process, for example to a template or a mold of nanoimprint lithography, which can be used instead of a photomask. Further, the method according to the invention and the apparatus according to the invention can be used to assess the quality of a wafer during the processing thereof. In general, the method described in this application can be used to assess the quality of objects whose design data are present and whose defects can be imaged.

Figure 1:
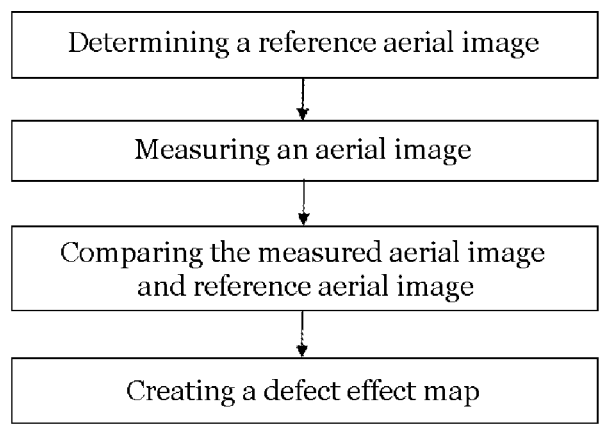
FIG. 1 schematically reproduces the currently frequently used workflow for assessing the quality of an element of a photolithography process.

FIG. 1 schematically shows the currently preferably used workflow for assessing the quality of a photomask. A currently frequently used method for ascertaining a defect effect map for a photolithographic mask provides the determination of a reference aerial image for a region of a mask to be examined in a first step. Should a mask comprise many regions or partial areas, or at least a plurality thereof, which contain the same arrangement of pattern elements, a defect-free region of the mask can be selected to record a reference aerial image. For the purposes of measuring an aerial image, and hence also for measuring a reference aerial image, use can be made, for example, of an AIMS™ (aerial image metrology system) tool and/or a PROVE® tool for determining placement errors, or a WLCD for determining the critical dimension (CD).

In semiconductor and micro-systems technology, the term "CD" for critical dimension denotes a defined size in a test structure, the measurement of which allows statements to be made about the quality of the manufacturing of a process step.

Should regions or partial areas with an identical arrangement of pattern elements not repeat on a mask, or only repeat at very long intervals, the above-described method (the so-called die-to-die method) for determining a reference aerial image cannot be used or can only be used with greater outlay, i.e., after a relatively long search for a suitable reference position. A method that can be used in such cases (but also independently thereof) for the purposes of generating a reference aerial image is the so-called die-to-database method, in which a reference aerial image is obtained by use of an optical imaging simulation (rendering) from design data, for example from layout data.

An ideal reference aerial image of a mask is calculated with the aid of an ab initio or a rigorous simulation. An ab initio simulation takes account of the optical interaction (scattering, diffraction, absorption, reflection) of the illumination radiation of the optical imaging system, i.e., of the electromagnetic waves incident on the photomask, with the structures of the photomask, and the subsequent propagation of the transmitted and/or the reflected electromagnetic fields upstream or downstream of the mask into the plane of the detector of an optical analysis system in numerically rigorous fashion on the basis of Maxwell's equations. This means that Maxwell's equations are solved in three dimensions for the respective boundary conditions by way of suitable numerical methods. This represents a particular challenge, in particular for the masks whose structures or patterns appear three-dimensional to the illumination radiation on account of the different materials of a photomask.

A simplified model which assumes the mask structures to be two-dimensional and the diffracted waves to be freely propagating is referred to as "Kirchhoff's model" or "scalar imaging model." A simulation of a reference aerial image on the basis of the Kirchhoff model is orders of magnitude faster; however, it is not able to image all mask effects sufficiently accurately.

After determining a reference aerial image (either by simulation or by measuring a defect-free mask portion), an aerial image of a region to be analyzed of a photomask or, in general, of an element of a photolithography process is measured in a second step. Once again, as specified above, this measurement can be implemented with the aid of one of the aforementioned tools, for example.

Thereupon, the positions of the respective pattern elements or the CD data, for example, are extracted from the two images, i.e., the measured aerial image and the reference aerial image, in a third step.

Subsequently, a defect effect map is created in a fourth step for a region to be examined or for the entire active surface of a photomask by comparing the two data records extracted from the two images. Here, the comparison of the two data records extracted from the two images can be implemented by forming a difference.

Finally, where necessary, the effects of the defects, for example the printable defects, can be ascertained in a portion of the mask or over the entire mask from the defect effect map on the basis of one or more thresholds (not illustrated in FIG. 1).

Figure 2:
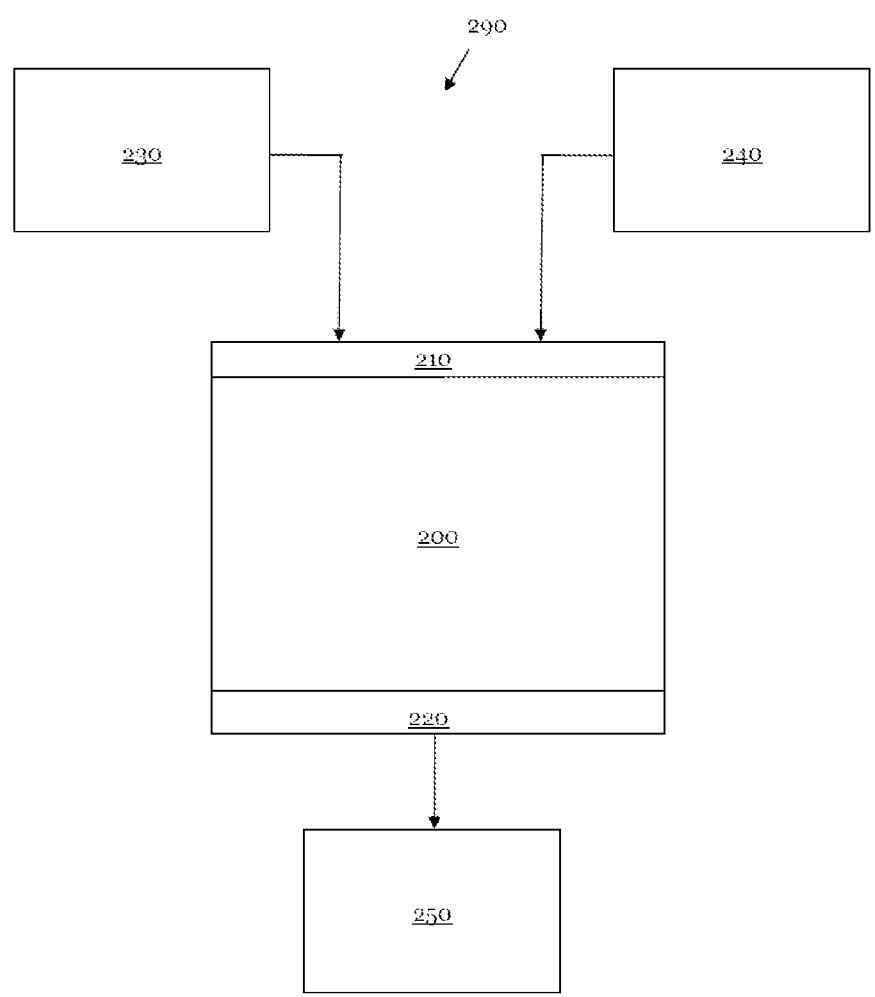
FIG. 2 schematically shows an example of a model of machine learning with an input layer, an output layer and the associated input data and output data.

The diagram 290 in FIG. 2 schematically shows an example of a model of machine learning 200 or an ML model 200, which illustrates a relationship between an aerial image 230, design data 240 associated with the aerial image 230 and one or more effects 250 of defects of an element of a photolithography process emerging from the aerial image 230. The ML model 200 can comprise an artificial neural network (ANN). The ANN can comprise a deep neural network. It is expedient to fit the model of machine learning 200 to the required prediction accuracy. By way of example, fitting of the model 200 can be implemented by an appropriate choice of number of layers. As an alternative or in addition thereto, it is advantageous to fit the functional description of the ML model 200 to the object to be achieved, specifically the prediction of one or more effects 250 of the defects, or to a defect effect map 250 of a photolithographic mask.

The ML model 200 has an input layer 210. The input data 230, 240 are provided to the trained ML model 200 via the input layer 210 during operation. In the application described here, the input data 230, 240 during operation are, firstly, a measured image or an aerial image 230 and, secondly, the design data 240 associated with the measured image or aerial image 230. By way of example, the design data 240 can be layout data or CAD (computer-aided design) data of a mask and can be present, for example, in the form of pixel data or, for instance, as polygons or polygonal chains. If the design data are available as polygons, it is necessary to convert the polygon chains into pixel data.

Further, the ML model 200 has an output layer 220, by means of which the trained model of machine learning 200 provides its output data 250, specifically the defect effect map 250, at the output. In the example illustrated in FIG. 2, this is a prediction of the effect(s) 250 of one or more defects of a photolithographic mask or of a portion of a photomask.

Figure 3:
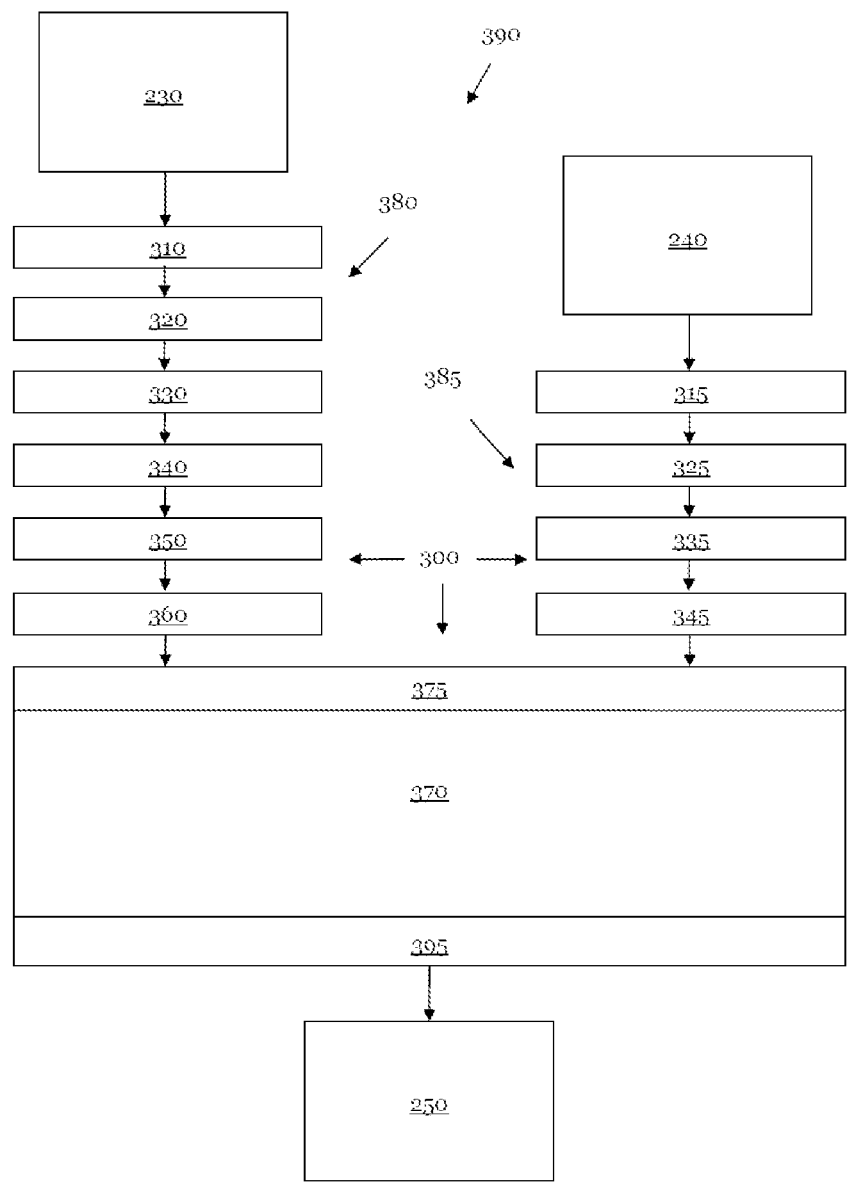
FIG. 3 schematically illustrates a section of a second example of a model of machine learning with two separate input branches.

The diagram 390 of FIG. 3 schematically shows an example of a model of machine learning 300, the architecture of which is specifically fitted to the object to be achieved. The exemplary ML model 300 of FIG. 3 has a first input branch 380 with six layers 310, 320, 330, 340, 350, 360, wherein the first layer 310 is configured as an input layer, by means of which the aerial image 230 is provided to the ML model 300. The layers 310 to 360 of the first input branch 380 of the ML model 300 pre-process the aerial image 230 such that the output of the first input branch 380 can be provided as an input for the first common layer 375 of the main part 370 of the ML model 300.

Further, the ML model 300 illustrated in an exemplary fashion in FIG. 3 has a second input branch 385 with four layers 315, 325, 335, 345. In a manner analogous to the first input branch 380, the first layer 315 of the second input branch 385 is embodied as an input layer, which serves to provide the design data 240 to the ML model 300. The layers 315 to 345 of the second input branch 385 of the ML model 300 process the design data 240 such that the output of the second input branch 385 can be provided as an input, parallel to the input of the first input branch 380, for the first common layer 375 of the main part 370 of the ML model 300. Like the ML model 200, the ML model 300 outputs its output data 250, specifically the defect effect map 250, via the output layer 395 of the main part 370.

Figure 4:
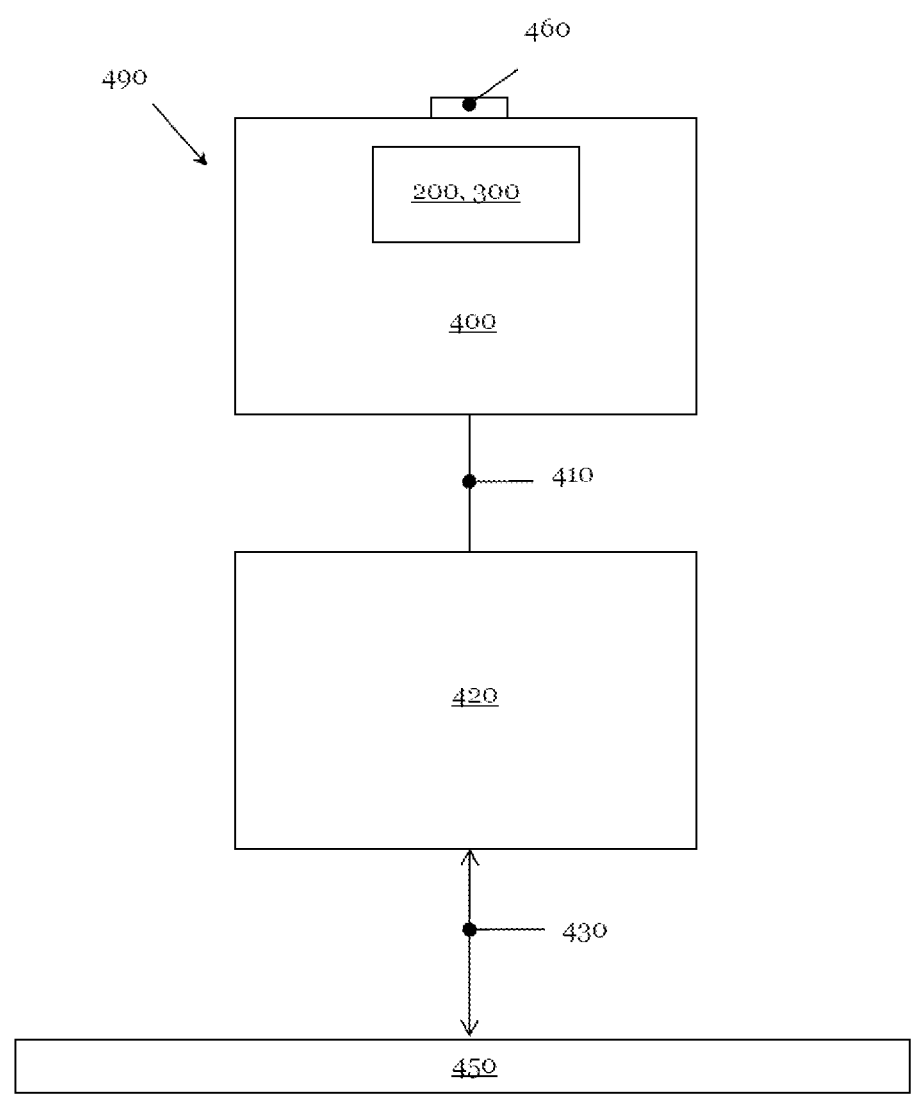
FIG. 4 schematically shows a section of an apparatus by means of which the method described in this application can be carried out.

Before the ML model 200, 300 can be used for predictive purposes, it can be trained using a data record that is as comprehensive as possible. FIG. 4 schematically shows a section through an apparatus 490 that can be used to measure aerial images 230. Further, the apparatus 490 can be used to measure aerial images, which are used as a part of a training data record for training the model 200, 300.

The apparatus 490 comprises a computer system 400, which is linked to a measuring device 420 by way of a connection 410. The connection 410 can be embodied in a wired or wireless manner. In the example illustrated in FIG. 4, the measuring device 420 examines a photolithographic mask 450 by use of the interaction 430. The mask 450 can be a transmitting or a reflecting mask. The photomask 450 of FIG. 4 is an example of an element 450 of a photolithography process. The measuring device 420 can be an imaging measuring device 420. By way of example, the measuring device 420 can be an AIMS™ or an AIMS™ EUV, i.e., an AIMS for the extreme ultraviolet wavelength range. Further, the measuring device 420 can comprise a PROVE® tool and/or a WLCD tool. The measuring device 420 can be used to produce an aerial image focus stack by varying the focal plane. As a result, the measuring device 420 facilitates the measurement of an aerial image focus stack of the mask 450.

In addition to an optical measuring device 420, which analyzes the mask 450 and produces an aerial image 230 by use of a photonic interaction, the measuring device 420 can, however, also interact 430 with the mask 450 with the aid of a neutral or charged partial beam and can generate an image of the sample, i.e., the photolithographic mask 450, on the basis of reflected and/or transmitted neutral and/or charged particles. The measuring device 420 can comprise a scanning electron microscope, particularly if the element of the photolithography process describes a wafer (not shown in FIG. 4).

However, the measuring device 420 can also comprise a scanning probe microscope, which probes a surface of the mask 450 and, as a result, produces an image of the surface contour of the mask 450 or, more generally, of an element 450 of a photolithography process (not illustrated in FIG. 4). A scanning probe microscope can comprise a scanning force microscope, for example. Moreover, it is possible for the measuring device 420 to comprise an imaging measuring device and, additionally, a scanning probe microscope, for example. A three-dimensional image of the mask 450 can be produced on the basis of the measurement data of an imaging measuring device and of a scanning probe microscope.

The computer system 400 controls the measuring device 420 by way of the connection 410. Further, the computer system 400 receives measurement data of the measuring device 420 by way of the connection 410. The computer system 400 of FIG. 4 can produce an aerial image 230 from the measurement data of the measuring device 420. Further, in the example illustrated in FIG. 4, the computer system 400 comprises the ML model 200, 300. The computer system 400 is designed to execute the trained ML model 200, 300. Further, the computer system 400 is configured so that it can carry out the training of the ML model 200, 300 described below. Graphics processors (GPU, graphical processor unit) are particularly suitable for executing models of machine learning 200, 300. It is therefore advantageous if the computer system 400 contains one or more capable graphics processors or another objective-optimized computer hardware, for instance a tensor processing unit (TPU) by Google (not illustrated in FIG. 4).

Further, the computer system 400 comprises an interface 460. The computer system 400 can receive design data 240 or layout data 240 belonging to the mask 450, which are analyzed by the measuring device 420, via the interface 460. The interface 460 can be a wireless or wired communications interface to an intranet or the Internet. Further, the interface 460 can comprise a data medium drive.

The training of the ML models 200, 300 of FIGS. 2 and 3 is explained in exemplary fashion on the basis of FIGS. 5 to 8 below. The model 200, 300 can be trained with the aid of the apparatus 490 of FIG. 4. However, for the purposes of carrying out the training of the ML model 200, 300, it is also possible to provide a computer system designed specifically to this end, the input data 230, 240 and corresponding output data being provided to said computer system.

Figure 5:
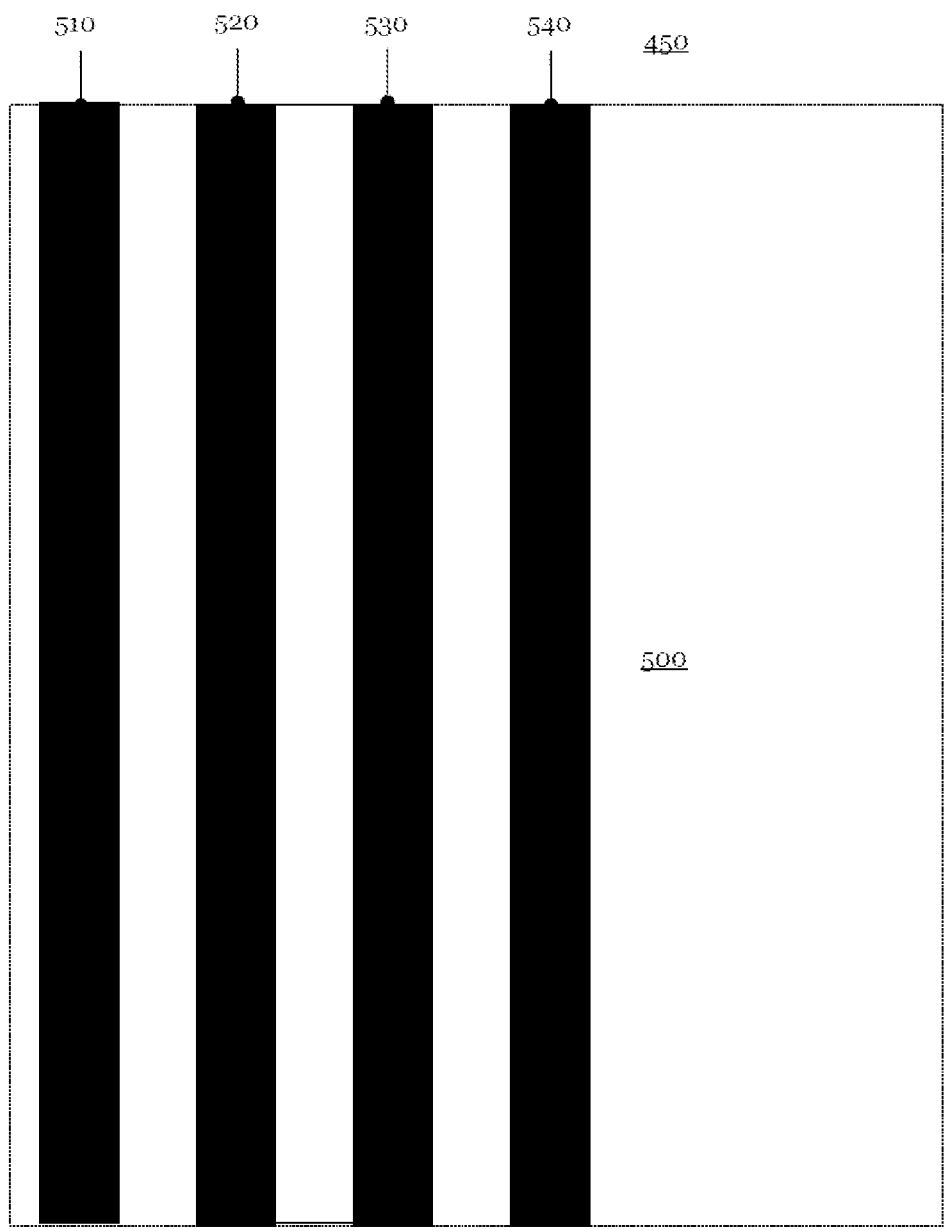
FIG. 5 schematically illustrates a reference aerial image of a portion of an element of a photolithography process.

FIG. 5 schematically shows a plan view of a reference aerial image 500 for a portion of the photolithographic mask 450. The reference aerial image 500 illustrated in FIG. 5 in an exemplary fashion presents a vertical strip structure with four strips 510, 520, 530, 540, which have a material that absorbs the actinic wavelength of the photolithographic mask 450. The strip structure of the reference aerial image 500 in FIG. 5 has substantially no defects. Here, like at other points of the present application, the expression "substantially" means a measurement which has no detectable changes in relation to a predetermined design if use is made of measuring appliances according to the prior art for the measurement.

By way of example, the reference aerial image 500 of FIG. 5 can be measured by the measuring device 420 of the apparatus 490. To this end, a location on the mask 450 is selected, which comprises the strip structure 510, 520, 530, 540 reproduced in FIG. 5 and which is known to be a location at which the mask 450 has no defects.

However, should the mask 450 not have a defect-free strip structure 510, 520, 530, 540 in the vicinity of a region of the mask 450 to be examined or should the strip structure reproduced in the reference aerial image 500 only be present once on the photomask 450, the reference aerial image 500 is produced from the design data 240 of the mask 450, which correspond to the reference aerial image 500, with the aid of a simulation tool. As already explained above, a simulation for generating the reference aerial image 500 can be performed on the basis of a rigorous or ab initio simulation of the design data 240 by way of a numerical solution of Maxwell's equations for the portion of the photomask 500 which is reproduced by the reference aerial image 500. Carrying out a rigorous simulation supplies a highly precise reference aerial image 500; however, this is often a time-consuming process.

Depending on the accuracy required by the reference aerial image 500, it can therefore be an alternative to implement the reference aerial image 500 on the basis of a so-called "Kirchhoff model" or a "scalar imaging model." This simulation process requires significantly less outlay in comparison with the rigorous simulation.

Figure 6:
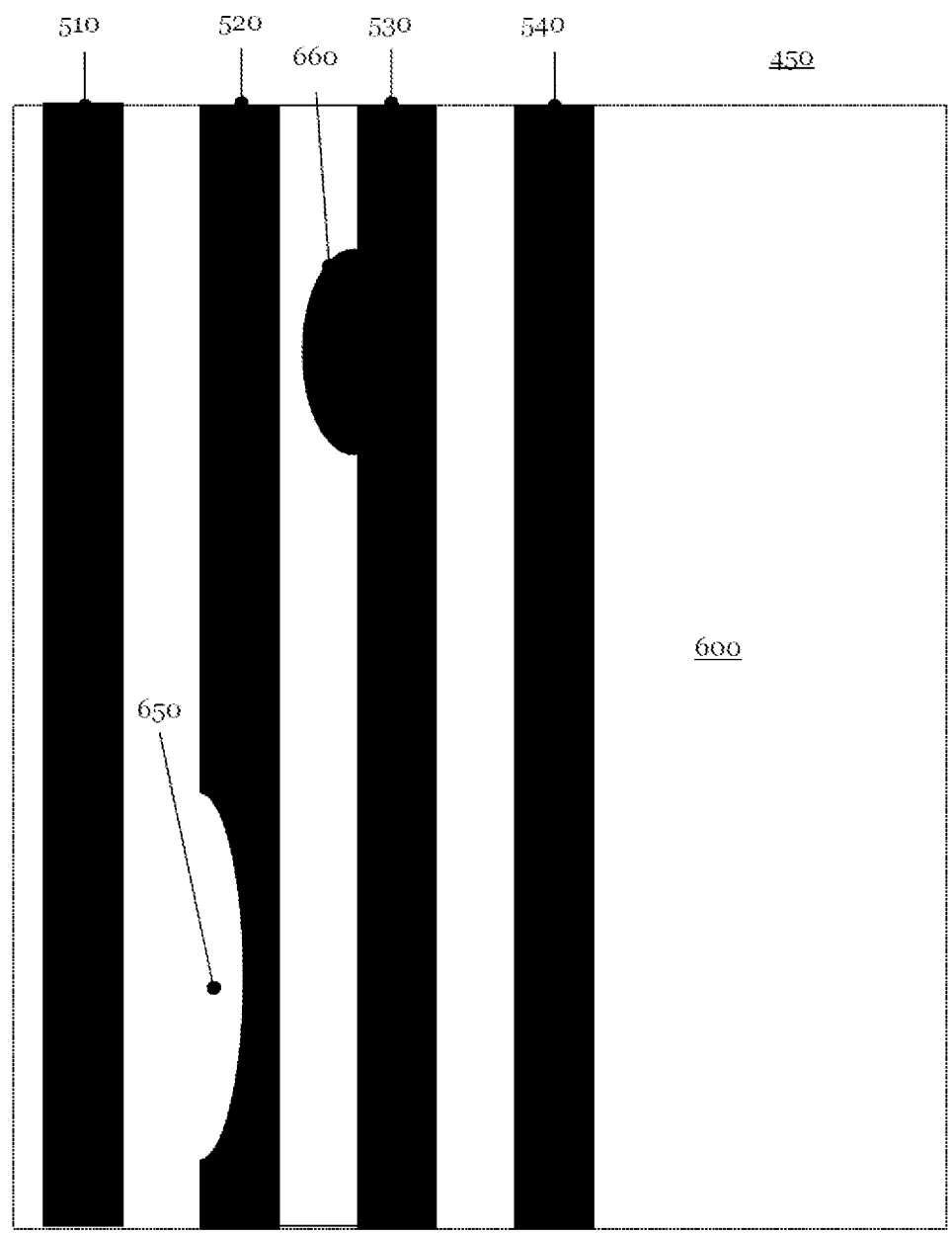
FIG. 6 schematically shows an aerial image of a portion of an element of a photolithography process.

FIG. 6 shows a measured aerial image 600 of the photomask 450 for the same portion of the mask 450 as in FIG. 5. In the example illustrated in FIG. 6, the strip 520 has a defect 650 of missing absorber material. Moreover, the third strip 530 has a defect 660 of excess absorbing material in the measured exemplary aerial image 600. The measured aerial image 600 can be part of a training data record. However, the measured aerial image 600 can also be input together with the associated design data 240 into the trained model 200, 300 for the purposes of predicting the effect 250 of the defects 650, 660. Finally, a simulated aerial image of a training data record, which was generated on the basis of modified design data with the aid of a simulation tool, could have a very similar look to the measured aerial image 600.

Figure 7:
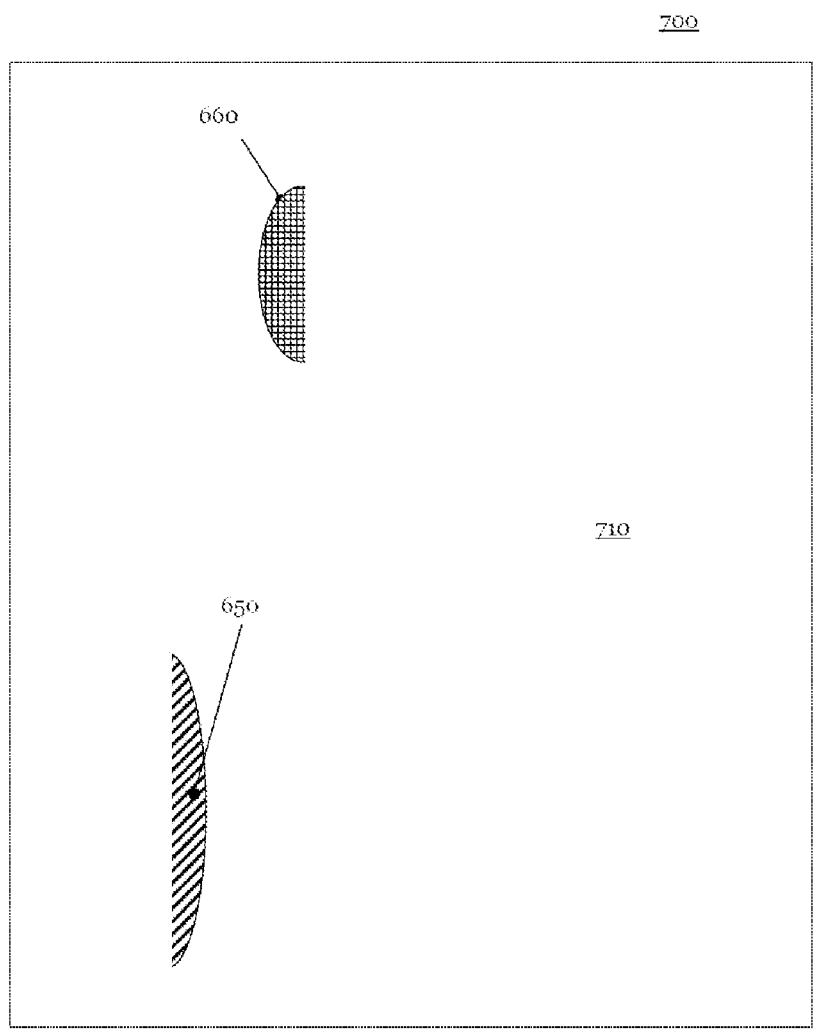
FIG. 7 schematically presents a portion of a defect probability map.

FIG. 7 presents a portion 710 of a special manifestation of a defect effect map 700. The portion 710 of the defect effect map 700 is formed by comparing the reference aerial image 500 with the measured aerial image 600. In detail, the portion 710 of the defect effect map 700 can be formed by forming the difference between the reference aerial image 500 and the measured aerial image 600. As already explained above, the difference image is implemented on the basis of greyscale values of the reference aerial image 500 and the measured aerial image 600. Since the difference image has a higher bit depth than the reference aerial image 500 and the measured aerial image 600, the defects 650, 660 of missing absorber material 650 and excess absorber material 660 can be distinguished in the portion 710 of the defect effect map 700. By virtue of portions 710 of the defect effect map 700 being determined over the entire mask 450 or over all relevant regions of the mask 450, it is possible to generate a defect effect map 700 for the photolithographic mask 450 or, in general, for an element 450 of a photolithography process. The portion 710 of the defect effect map 700 can be incorporated into a training data record for the model 200, 300 as corresponding effect of the defects 650, 660.

Figure 8:
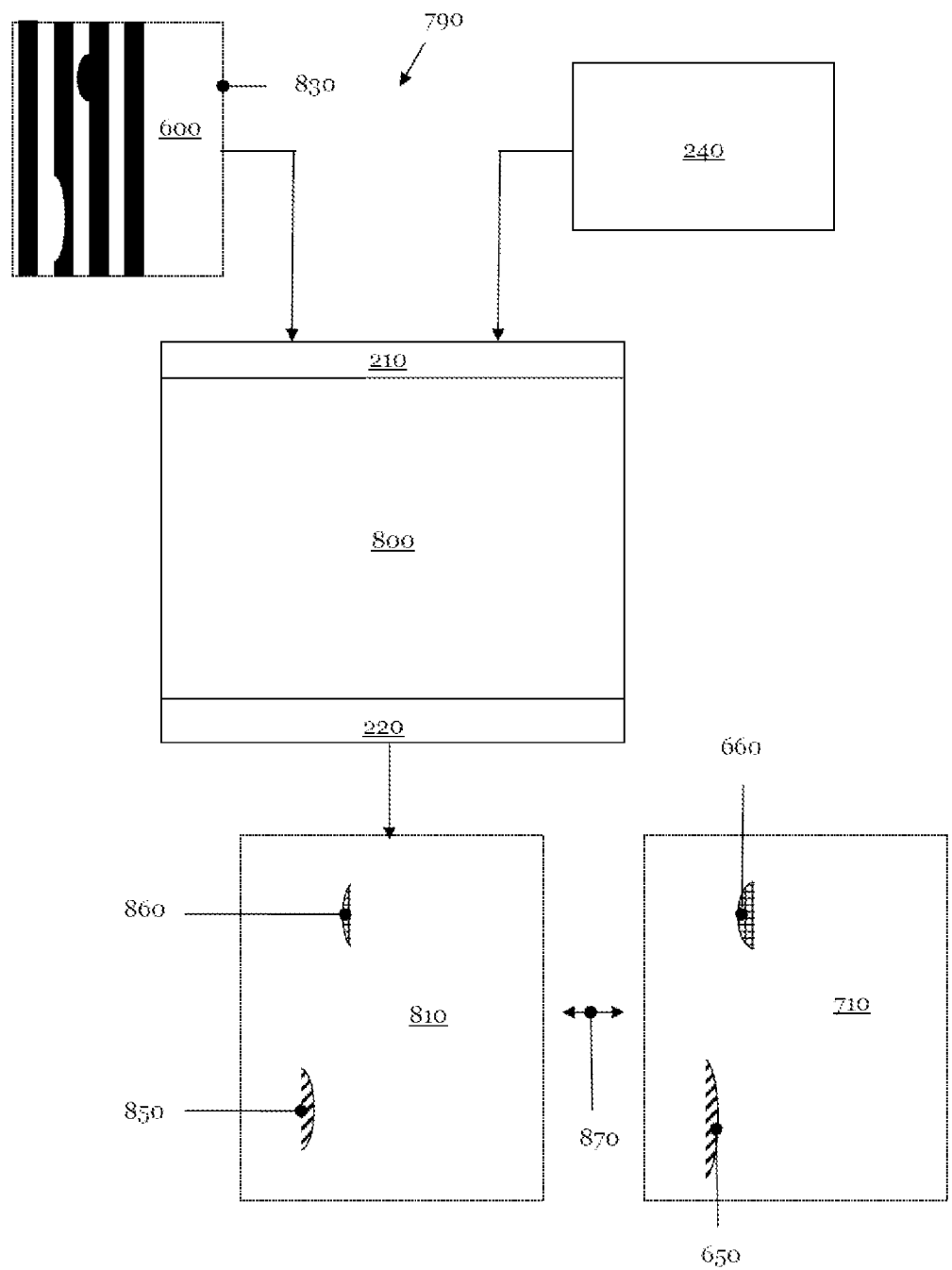
FIG. 8 schematically elucidates a training cycle of the training phase of a model of machine learning.

A sufficient availability of consistent and representative training data is important for determining the internal model parameters of the ML model 200, 300 in a training process. FIG. 8 schematically shows an example of a training cycle for the model 800. In terms of design and in respect of the functional characterization, the model 800 of FIG. 8 is identical to the model 200, 300 of FIGS. 2 and 3. However, unlike the model 200, 300, the model 800 has not yet been trained. In the example illustrated in FIG. 8, the measured aerial image 600 and the associated design data 240 are provided as input data of the training sequence to the input layer 210 of the model of machine learning 800. At its output layer 220, the model 800 in training predicts the portion 810 of a defect effect map with the defects 850 and 860 from these input data. The portion 810 of the defect effect map is compared to the portion 710 of the defect effect map 700 of FIG. 7. In FIG. 8, the comparison is indicated by the double-headed arrow 870.

Depending on the selected ML model 800, there are various methods to determine the model parameters of the ML model 800 during a training phase. By way of example, the "stochastic gradient descent" iterative technique or corresponding variants have become established for ML models 800 that are available in the form of deep neural networks. In this training method, the training data, i.e., the aerial image 830 used for training purposes, for example the measured aerial image 600 and the associated design data 240, are repeatedly presented to the model 800, i.e., the latter calculates the portion 810 of a defect effect map using the current model parameters and compares the calculated portion 810 to the measured portion 710 of the defect effect map 700. The model parameters of the ML model 800 are modified in the case of deviations between the two portions 710 and 810. Typically, the training phase for an input data record is terminated when the portion 810 has reached a (local) optimum, meaning that the deviations between the portions 710 and 810 hardly change any more over all image pairs, or after a predetermined time interval has expired or a predetermined number of training steps have been run through. Alternatively, a training process of the ML model 800 can be completed when the validation accuracy significantly increases when use is made of a separate validation data record, this being an indication for overfitting of the ML model 800.

The model 800 can be trained in two steps. In a first step, aerial images 830 in the form of simulated aerial images used for training purposes can be provided together with associated design data 240 to the input layer 210 of the model 800. In a second step, measured aerial images 600 are subsequently presented to the model 800 as aerial images 830 used for training purposes, together with the corresponding design data 240.

Before the trained ML model 200, 300 is used, the predictive power of the trained model 200, 300 can be analyzed with the aid of a verification step. When verifying the trained model 200, 300, the precision of the prediction of the trained model 200, 300 is analyzed on the basis of an independent validation data record.

Figure 9:
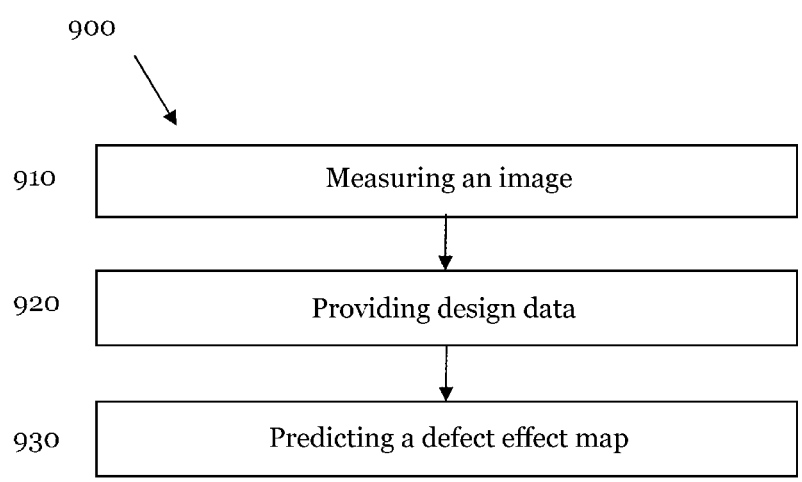
FIG. 9 schematically reproduces the workflow for assessing the quality of an element of a photolithography process when a trained model is used to this end, said trained model establishing a relationship between a measured aerial image and the associated design data and thereby facilitating a prediction of a defect distribution of an element of a photolithography process.

The diagram 900 of FIG. 9 shows the workflow for assessing the quality of an element 450 of a photolithography process if the trained model 200, 300 is used in the process instead of a comparison of a reference aerial image 500 with a measured aerial image 600. Initially, an aerial image 600 of a photolithographic mask 450 is measured in step 910. Thereupon, the design data 240 belonging to the measured aerial image 600 are provided to the trained model of machine learning 200, 300 in step 920. The trained ML model 200, 300 directly ascertains the effect 250 of the defects 650, 660 of the aerial image 600 in step 930 on the basis of the measured aerial image 600 and the associated design data 240. The workflow reproduced in FIG. 9 avoids the determination of a reference aerial image 500.

Finally, the flowchart 1000 of FIG. 10 presents the workflow of a method for determining at least one unknown effect of defects 650, 660 of an element 450 of a photolithography process. The method begins in step 1010. In step 1020, a model of machine learning 200, 300 is provided for a relationship between an aerial image 600, design data 240 associated with the aerial image 600 and an effect of the defects 650, 660 of the element 450 of the photolithography process arising from the aerial image 600.

In the next step 1030, the model of machine learning 200, 300 is trained using a multiplicity of aerial images 830 used for training purposes, design data 240 associated with the aerial images 830 used for training purposes and corresponding effects 710 of the defects 650, 660.

Thereupon, in step 1040, the unknown effect of the defects 650, 660 is determined by applying the trained model 200, 300 to a measured aerial image 600 and the design data 240 associated with the measured aerial image 600. Finally, the method ends in step 1050.

What is claimed is:

1. A method for determining at least one unknown effect of defects of an element of a photolithography process, wherein the method comprises the steps of:
   a. providing a model of machine learning for a relationship between an image, design data associated with the image and at least one effect of the defects of the element of the photolithography process arising from the image;
   b. training the model of machine learning using a multiplicity of images used for training purposes, design data associated with the images used for training purposes and corresponding effects of the defects; and
   c. determining the at least one unknown effect of the defects by applying the trained model of machine learning to a measured image and the design data associated with the measured image.

2. The method of claim 1, wherein the image comprises at least one element from the group: an image recorded by an optical imaging system, an image recorded by a scanning particle microscope, or an image recorded by a scanning probe microscope.

3. The method of claim 1, wherein the model of machine learning comprises at least one element from the group: a parametric mapping, an artificial neural network, a deep neural network, a time delay neural network, a convolutional neural network, a recurrent neural network, a long short-term memory network, or a generative model.

4. The method of claim 1, wherein the model of machine learning comprises:
   a. at least one encoder block for determining information-carrying features of an image and the design data associated with the image; and
   b. at least one decoder block for producing at least one effect of the defects from the determined information-carrying features, wherein the at least one effect of the defects shows what an overlay of the image with a reference image looks like.

5. The method of claim 1, wherein the element of a photolithographic process comprises at least one element of the group: a photolithographic mask, a template for nano-imprint technology, or a wafer.

6. The method of claim 1, wherein the defects comprise at least one element from the group: placement errors of one or more pattern elements of the element of the photolithography process; critical dimension errors of one or more pattern elements of the element of the photolithography process; and overlay errors of two or more photolithographic masks.

7. The method of claim 1, wherein determining the at least one unknown effect of a defect comprises at least one of: determining whether the effect of the defect is below a predetermined threshold, determining whether the defect is visible on a wafer, or whether the defect visible on the wafer is correctable.

8. The method of claim 1, wherein the image recorded by an optical imaging system comprises at least one of: an aerial image or at least two images of an aerial image focus stack.

9. The method of claim 1, wherein training the model of machine learning comprises assessing the trained model of machine learning based on validation data.

10. The method of claim 1, wherein training of the model of machine learning comprises: providing the plurality of images used for training purposes and the plurality of design data associated with the images used for training purposes as input data and providing the plurality of effects of the defects corresponding to the images used for training purposes as comparison data for the output data of the model of machine learning.

11. The method of claim 1, wherein the design data comprises at least one element of the group: layout data or computer-aided design data.

12. The method of claim 1, wherein the design data comprises at least one element of the group: pixel data, polygons, or polygon chains.

13. The method of claim 1, further comprising adapting a number of layers of the model of machine learning to a predetermined accuracy of the image.

14. The method of claim 1, wherein images used for training purposes comprise measured images and/or simulated images.

15. The method of claim 1, further including the step of: simulating design data and/or modified design data of the element for the photolithography process for the purposes of producing simulated images.

16. The method of claim 1, wherein producing simulated images comprises at least one element from the group: carrying out a rigorous simulation by numerically solving Maxwell's equations, wherein design data and/or modified design data of the element of the photolithography process are used as input data, carrying out a simulation with the aid of a Kirchhoff model, wherein the design data and/or the modified design data of the element of the photolithography process are used as input data, carrying out a particle-beam-based imaging simulation, wherein design data and/or modified design data of the element of the photolithography process are used as input data and carrying out a scanning-probe-based imaging simulation, wherein design data and/or modified design data of the element of the photolithography process are used as input data.

17. The method of claim 1, wherein the provision of corresponding effects of the defects for the purposes of training the model of machine learning further comprises the step of: overlaying an image used for training purposes with a reference image for producing the at least one effect of the defects corresponding to the image.

18. The method of claim 1, wherein the provision of corresponding effects of the defects for the purposes of training the model of machine learning further comprises the step of: determining a reference image by: imaging a substantially defect-free region of the element of the photolithography process, which has the same pattern elements as the region of the measured image, and/or simulating the design data for the region of the measured image of the element of the photolithography process.

19. The method of claim 17, wherein overlaying the image with the reference image comprises: forming a difference between the image and the reference image.

20. The method of claim 19, wherein forming the difference comprises at least one element from the group: determining a deviation of a critical dimension, determining a contrast deviation, and determining a placement deviation of one or more pattern elements.

21. The method of claim 1, wherein the training of the model of machine learning comprises:
  a. training the model of machine learning using a first number of simulated images, design data associated with the simulated images with corresponding effects of the defects in a first phase; and
  b. training the model of machine learning using a second number of measured images, design data associated with the measured images with corresponding effects of the defects in a second phase, with the first phase being carried out before the second phase.

22. The method of claim 1, wherein the first number of simulated images is greater than the second number of measured images.

23. The method of claim 21, wherein steps (a) and (b) are run through at least twice.

24. A computer program product comprising instructions which, when executed by a computer system, prompt the computer system to carry out the method steps of claim 1.

25. An apparatus for determining at least one unknown effect of defects of an element of a photolithography process, comprising:
  a. means for providing a model of machine learning for a relationship between an image, design data associated with the image and at least one effect of the defects arising from the image;
  b. means for training the model of machine learning using a multiplicity of images used for training purposes, design data associated with the images used for training purposes and the corresponding effects of the defects; and
  c. means for determining the unknown effect of the defects by applying the trained model of machine learning to a measured image and the design data associated with the measured image.

26. The apparatus of claim 25, wherein the apparatus comprises an exposure system for the element of the photolithography process and a magnifying lens that is embodied to image a portion of the element of the photolithography process on a photodetector.

* * * * *